United States Patent
Lee et al.

(10) Patent No.: US 6,577,658 B1
(45) Date of Patent: Jun. 10, 2003

(54) METHOD AND APPARATUS FOR PLANAR INDEX GUIDED VERTICAL CAVITY SURFACE EMITTING LASERS

(75) Inventors: Hsing-Chung Lee, Calabasas, CA (US); Liew-Chuang Chui, Singapore (SG)

(73) Assignee: E20 Corporation, Inc., Calabasas, CA (US)

( * ) Notice: Subject to any disclaimer, the term of this patent is extended or adjusted under 35 U.S.C. 154(b) by 0 days.

(21) Appl. No.: 09/400,359

(22) Filed: Sep. 20, 1999

(51) Int. Cl.[7] .............................. H01S 5/00; H01S 3/08
(52) U.S. Cl. .............................. 372/45; 372/46; 372/96
(58) Field of Search ....................... 372/50, 46, 45

(56) References Cited

U.S. PATENT DOCUMENTS

| | | |
|---|---|---|
| 3,560,275 A | 2/1971 | Kressel et al. |
| 3,878,105 A | 4/1975 | Palmer |
| 3,974,514 A | 8/1976 | Kressel et al. |
| 3,978,428 A | 8/1976 | Burnham et al. ............. 372/48 |
| 4,033,796 A | 7/1977 | Burnham et al. ............. 438/43 |
| 4,110,661 A | 8/1978 | Harris, Jr. et al. |
| 4,249,967 A | 2/1981 | Liu et al. |
| 4,309,670 A | 1/1982 | Burnham et al. |
| 4,347,611 A | 8/1982 | Scifres et al. .................. 372/45 |
| 4,376,946 A | 3/1983 | Kaminow et al. ............. 385/49 |
| 4,573,163 A | 2/1986 | Kaminow .................... 372/96 |
| 4,633,476 A | 12/1986 | Scifres et al. .................. 372/45 |
| 4,636,821 A | 1/1987 | Yanase et al. |
| 4,675,875 A | 6/1987 | Takamiya |
| 4,694,459 A | 9/1987 | Burnham et al. ............. 372/45 |
| 4,730,326 A | 3/1988 | Taneya et al. ................. 372/44 |
| 4,740,481 A | 4/1988 | Wilson et al. ............... 438/659 |
| 4,754,462 A | 6/1988 | Yamamoto et al. ............ 372/45 |
| 4,757,509 A | 7/1988 | Isshiki et al. .................. 372/45 |
| 4,764,936 A | 8/1988 | Taneya et al. ................. 372/50 |
| 4,766,470 A | 8/1988 | School et al. |
| 4,772,082 A | 9/1988 | Matsui et al. ............... 385/131 |

(List continued on next page.)

FOREIGN PATENT DOCUMENTS

| | | |
|---|---|---|
| EP | 0 334 637 A2 | 9/1989 |
| EP | 0 473 983 A2 | 3/1992 |
| GB | 2 293 919 A | 4/1996 |

OTHER PUBLICATIONS

B. Tell, K.F. Brown–Goebeler, R.E. Leibengeth, F.M. Baez & Y.H. Lee; Temperature dependence of GaAs–AlGaAs vertical cavity surface emitting lasers; Appl. Phys. Lett. 60 (6), Feb. 10, 1992.

B. Tell, K.F. Brown–Goebeler & R.E. Leibengeth; Thermal characteristics of Deep Red (1.77um) vertical–cavity surface–emitting lasers; IEEE Photonics Technology Letters, vol. 4., No. 6; Jun. 1992. pp. 521–523.

(List continued on next page.)

*Primary Examiner*—Quyen Leung
(74) *Attorney, Agent, or Firm*—Blakely Sokoloff Taylor & Zafman, LLP

(57) ABSTRACT

Planar index guided vertical cavity surface emitting laser (PIG VCSEL) utilizes index guiding to provide improved optical confinement and proton implantation to improve current confinement. Index guiding is achieved by etching index guide openings (holes or partial ridges) around the optical confinement region and may be adjusted by varying the etched volume of the index guide openings (holes and partial ridges). The top contact surface area is increased in the PIG VCSEL thereby lowering contact and device resistance to improve VCSEL performance further. The PIG VCSEL is a substantially planarized device for ease of manufacture.

119 Claims, 8 Drawing Sheets

U.S. PATENT DOCUMENTS

| | | |
|---|---|---|
| 4,819,048 A | 4/1989 | Mand et al. |
| 4,847,844 A | 7/1989 | Noda et al. |
| 4,852,110 A | 7/1989 | Fujii et al. .................... 372/44 |
| 4,853,936 A | 8/1989 | Matsui et al. ................. 372/45 |
| 4,856,014 A | 8/1989 | Figueroa et al. ............. 372/46 |
| 4,856,017 A | 8/1989 | Ungar .......................... 372/96 |
| 4,942,585 A | 7/1990 | Ungar .......................... 372/44 |
| 4,943,970 A | 7/1990 | Bradley |
| 4,949,350 A | 8/1990 | Jewell et al. ................. 372/45 |
| 4,949,351 A | 8/1990 | Imanaka |
| 4,958,202 A | 9/1990 | Kinoshita et al. ............ 257/96 |
| 4,967,241 A | 10/1990 | Kinoshita et al. |
| 4,974,036 A | 11/1990 | Kapon ......................... 257/17 |
| 4,982,409 A | 1/1991 | Kinoshita et al. ............ 372/45 |
| 4,990,466 A | 2/1991 | Shieh et al. .................. 438/36 |
| 4,991,179 A | 2/1991 | Deppe et al. |
| 5,018,157 A | 5/1991 | Deppe et al. |
| 5,029,175 A | 7/1991 | Ohnaka et al. ............... 372/46 |
| 5,033,053 A | 7/1991 | Shimizu et al. |
| 5,033,054 A | 7/1991 | Scifres et al. |
| 5,034,958 A | 7/1991 | Kwon et al. .................. 372/45 |
| 5,038,356 A | 8/1991 | Botez et al. |
| 5,040,032 A | 8/1991 | Kapon ......................... 257/14 |
| 5,043,775 A | 8/1991 | Lee |
| 5,045,498 A | 9/1991 | Wang et al. |
| 5,050,155 A | 9/1991 | Kurata et al. |
| 5,063,569 A | 11/1991 | Xie |
| 5,068,868 A | 11/1991 | Deppe et al. |
| 5,088,099 A | 2/1992 | Chen et al. ................... 372/45 |
| 5,115,441 A | 5/1992 | Kopf et al. ................... 372/45 |
| 5,115,442 A | 5/1992 | Lee et al. |
| 5,128,955 A | 7/1992 | Danielmeyer ................ 372/94 |
| 5,132,982 A | 7/1992 | Chan et al. ................... 372/50 |
| 5,136,603 A | 8/1992 | Hasnain et al. ............... 372/50 |
| 5,143,863 A | 9/1992 | Ohnaka et al. ............... 438/39 |
| 5,148,267 A | 9/1992 | Ty Tan et al. |
| 5,155,560 A | 10/1992 | Sheperd ...................... 257/189 |
| 5,159,603 A | 10/1992 | Kim |
| 5,160,492 A | 11/1992 | Wang et al. |
| 5,164,329 A | 11/1992 | Moyer et al. ................. 438/36 |
| 5,206,871 A | 4/1993 | Deppe et al. ................. 372/45 |
| 5,216,686 A | 6/1993 | Holm et al. |
| 5,231,642 A | 7/1993 | Scifres et al. ................ 372/45 |
| 5,233,204 A | 8/1993 | Fletcher et al. |
| 5,237,581 A | 8/1993 | Asada et al. |
| 5,239,189 A | 8/1993 | Lawrence |
| 5,245,622 A | 9/1993 | Jewell et al. ................. 372/45 |
| 5,247,167 A | 9/1993 | Bargerhuff et al. |
| 5,249,245 A | 9/1993 | Lebby et al. |
| 5,255,278 A | 10/1993 | Yamanaka |
| 5,256,596 A | 10/1993 | Ackley et al. ................ 438/39 |
| 5,258,316 A | 11/1993 | Ackley et al. ................ 438/42 |
| 5,258,990 A | 11/1993 | Olbright et al. |
| 5,266,503 A | 11/1993 | Wang et al. .................. 438/42 |
| 5,272,375 A | 12/1993 | Belopolsky |
| 5,274,655 A | 12/1993 | Shieh et al. .................. 372/45 |
| 5,285,466 A | 2/1994 | Tabatabaie .................... 372/50 |
| 5,289,018 A | 2/1994 | Okuda et al. |
| 5,293,392 A | 3/1994 | Shieh et al. .................. 372/45 |
| 5,301,201 A | 4/1994 | Dutta et al. |
| 5,311,533 A | 5/1994 | Stutius et al. ................. 372/46 |
| 5,317,587 A | 5/1994 | Ackley et al. ................ 372/45 |
| 5,328,854 A | 7/1994 | Vakhshoori et al. |
| 5,331,654 A | 7/1994 | Jewell et al. |
| 5,341,002 A | 8/1994 | Plumb ......................... 257/95 |
| 5,343,487 A | 8/1994 | Scott et al. ................... 372/46 |
| 5,345,462 A | 9/1994 | Choquette .................... 372/45 |
| 5,351,257 A | 9/1994 | Lebby et al. |
| 5,359,447 A | 10/1994 | Hahn et al. |
| 5,359,618 A | 10/1994 | Lebby et al. .................. 372/45 |
| 5,363,393 A | 11/1994 | Uomi et al. |
| 5,379,312 A | 1/1995 | Bour et al. .................... 372/45 |
| 5,387,543 A | 2/1995 | Ackley ......................... 438/41 |
| 5,388,120 A | 2/1995 | Ackley et al. ................ 372/99 |
| 5,397,739 A | 3/1995 | Chalmers et al. |
| 5,397,917 A | 3/1995 | Ommen et al. |
| 5,399,885 A | 3/1995 | Thijs et al. |
| 5,400,356 A | 3/1995 | Bringans et al. ............. 372/46 |
| 5,403,774 A | 4/1995 | Shieh et al. .................. 438/36 |
| 5,412,680 A * | 5/1995 | Swirhun et al. .............. 372/45 |
| 5,416,044 A | 5/1995 | Chino et al. |
| 5,420,880 A | 5/1995 | Tabatabaie et al. |
| 5,422,901 A | 6/1995 | Lebby et al. ................. 372/36 |
| 5,426,657 A | 6/1995 | Vakhsoori |
| 5,436,192 A | 7/1995 | Epler et al. ................... 438/32 |
| 5,438,586 A | 8/1995 | Ishii et al. |
| 5,442,203 A | 8/1995 | Adomi et al. ................. 257/97 |
| 5,448,536 A | 9/1995 | Muranishi et al. |
| 5,457,328 A | 10/1995 | Ishimatsu et al. |
| 5,465,266 A | 11/1995 | Bour et al. .................... 372/46 |
| 5,468,656 A | 11/1995 | Shieh et al. .................. 438/32 |
| 5,475,701 A | 12/1995 | Hibbs-Brenner |
| 5,485,014 A | 1/1996 | Jain et al. ..................... 257/21 |
| 5,491,712 A | 2/1996 | Lin et al. ...................... 372/50 |
| 5,493,577 A | 2/1996 | Choquette et al. ........... 372/46 |
| 5,513,204 A * | 4/1996 | Jayaraman .................... 372/96 |
| 5,530,715 A | 6/1996 | Shieh et al. |
| 5,554,061 A | 9/1996 | Park et al. |
| 5,568,499 A | 10/1996 | Lear ............................. 372/45 |
| 5,568,504 A | 10/1996 | Kock et al. |
| 5,574,743 A | 11/1996 | Van der Poel et al. ....... 372/46 |
| 5,577,064 A | 11/1996 | Swirhun et al. .............. 372/96 |
| 5,596,595 A | 1/1997 | Tan et al. ...................... 372/96 |
| 5,606,572 A | 2/1997 | Swirhun et al. |
| 5,638,392 A | 6/1997 | Ramdani et al. ............. 372/45 |
| 5,657,339 A | 8/1997 | Fukunaga ..................... 372/50 |
| 5,671,243 A | 9/1997 | Yap .............................. 372/50 |
| 5,696,784 A | 12/1997 | Srinivasan et al. ........... 372/46 |
| 5,706,306 A | 1/1998 | Jiang et al. .................... 372/96 |
| 5,708,669 A | 1/1998 | DiGiovanni et al. .......... 372/6 |
| 5,708,674 A | 1/1998 | Beernink et al. ............. 372/50 |
| 5,712,865 A | 1/1998 | Chow et al. .................. 372/96 |
| 5,717,707 A | 2/1998 | Beernink et al. ............. 372/46 |
| 5,719,893 A | 2/1998 | Jiang et al. .................... 372/45 |
| 5,719,894 A * | 2/1998 | Jewell et al. .................. 372/45 |
| 5,732,099 A | 3/1998 | Kawasumi et al. ........... 372/48 |
| 5,732,103 A | 3/1998 | Ramdani et al. ............. 376/96 |
| 5,764,676 A | 6/1998 | Paoli et al. .................... 372/50 |
| 5,766,981 A | 6/1998 | Thornton et al. ............. 438/36 |
| 5,784,398 A | 7/1998 | Amann et al. ................ 372/50 |
| 5,796,769 A | 8/1998 | Ramdani et al. ............. 372/45 |
| 5,796,771 A | 8/1998 | DenBaars et al. ............ 372/75 |
| 5,812,576 A | 9/1998 | Bour ............................. 372/45 |
| 5,812,578 A | 9/1998 | Schemmann et al. ......... 372/46 |
| 5,815,524 A | 9/1998 | Ramdani et al. ............. 372/96 |
| 5,831,960 A | 11/1998 | Jiang et al. .................... 369/121 |
| 5,832,017 A | 11/1998 | Ramdani et al. ............. 372/45 |
| 5,832,019 A | 11/1998 | Paoli et al. .................... 372/46 |
| 5,838,707 A | 11/1998 | Ramdani et al. ............. 372/45 |
| 5,848,086 A | 12/1998 | Lebby et al. ................. 372/46 |
| 5,883,912 A | 3/1999 | Ramdani et al. ............. 372/45 |
| 5,896,408 A * | 4/1999 | Corzine et al. ............... 372/46 |
| 5,898,722 A | 4/1999 | Ramdani et al. ............. 372/50 |
| 5,903,590 A | 5/1999 | Hadley et al. ................ 372/96 |
| 5,914,973 A | 6/1999 | Jiang et al. .................... 372/36 |
| 5,917,848 A | 6/1999 | Claisse et al. ................ 372/96 |
| 5,943,359 A | 8/1999 | Ramdani et al. ............. 372/96 |
| 5,956,363 A | 9/1999 | Lebby et al. ................. 372/46 |
| 5,956,364 A | 9/1999 | Jiang et al. .................... 372/96 |
| 5,963,576 A | 10/1999 | Claisse et al. ................ 372/96 |
| 5,966,399 A | 10/1999 | Jiang et al. .................... 372/96 |

| | | | |
|---|---|---|---|
| 5,978,408 A | * 11/1999 | Thornton | 372/96 |
| 5,985,686 A | 11/1999 | Jayaraman | 438/32 |
| 6,026,108 A | 2/2000 | Lim et al. | 372/50 |
| 6,118,799 A | 9/2000 | Okubo et al. | 372/46 |
| 6,160,834 A | 12/2000 | Scott | |
| 6,169,757 B1 | 1/2001 | Merritt | 372/50 |
| 6,195,381 B1 | 2/2001 | Botez et al. | 372/96 |
| 6,252,894 B1 | 6/2001 | Sasanuma et al. | 372/45 |
| 6,256,330 B1 | 7/2001 | LaComb | 372/46 |

OTHER PUBLICATIONS

S. Jiang, M. Dagenais and R. Morgan; Multimode behavior of a Vertical–Cavity Surface–Emitting Laser with Feedback from an External Reflecting Surface; Digest of LEOS Annual Meeting, Piscataway, NJ, 1994, p. 274–275. IEEE. Document No. IPD–P94–044. (no month available).

*Introduction to Lasers and Their Application*, Donald O'Shea et al. Addison–Wesley Publishing Company, Reading Massachusetts, Dec., 1978, pp. 156–167. (no month available).

*Optoelectronic Interconnects and Packaging*, Ray T. Chen, et al., SPIE Optical Engineering Press, Bellingham, Washington, Jan., 1996, pp. 3–34. (no month available).

*Laser Electronics—Third Edition*, Joseph T. Verdeyen, Prentice–Hall, Englewood Cliffs, New Jersey, 1995, pp. 440–588. (no month available).

*Introduction to fiber optics*, Ghatak et al, Cambridge University Press, Cambridge, UK, 1998, pp. 200–237.

*Semiconductor Lasers II—Materials and Structures*, Eli Kapon, ed., Academic Press, San Diego, California , 1999, pp. 1–380. (no month available).

"Lasing Threshold in Quantum well surface–emitting lasers: Many–body effects and temperature dependence," Gourley, et al., Appl. Phys. Lett., vol. 55, No. 26, Dec. 25, 1989, pp 2698–2700.

"GaAs Vertical–Cavity Surface Emitting Lasers Fabricated by Reacitve Ion Etching," Choquette, et al., IEEE Photonics Technology Letters, vol. 3, No. 10, Oct., 1991.

"Use of Implant Isolation for Fabrication of Vertical Cavity Surface–emitting Laser Diodes," Tai, et al., Electronics Letters, Nov. 23$^{rd}$ 1989, Vol. 25, No. 24.

"90% Coupling of Top Surface Emitting GaAs/AlGaAs Quantum Well Laser Output into 8$\mu$m Diameter Core Silica Fibre," Tai, et al., Electronics Letters, Sep. 13, 1990, vol. 26, No. 19.

*Surface Emitting Semiconductor Lasers and Arrays*, Chapter 3, p. 71–72 and Fig. 1 Page., "Vertical–Cavity Surface Emitting Laser and Arrays" by Kenichi Iga and Fumio Koyama, Academic Press, Inc., 1993. (no month available).

"Submilliamp Threshold Vertical–cavity Laser Diodes," Geels, et al., Appl. Phys. Lett. 57(16) Oct. 15, 1990, pp. 1605–1607.

"Low–threshold operation of a GaAs single quantum well mushroom structure surface–emitting laser,"Yang, et al., Appl. Phys. Lett. Apr. 22, 1991, pp. 1780–1782. vol. 58(16).

"Low threshold Planarized Vertical–Cavity Surface–Emitting Lasers," Geels, et al., IEEE Phototonics Technology Letters, vol. 2, No. 4, Apr., 1990. pp 234–236.

*The Electrical Engineering Handbook*, Richard C. Dorf, Ed., CRC Press, Boca Raton, Florida, 1993, "Chapter 30: Optoelectronics," Hecht, et al., pp. 738–751. (no month available).

*Solid State Electronic Devices*, 3d Edition, Ben G. Streetman, Prentice Hall, Englewood Cliffs, New Jersey, pp. 387–398 (no month available).

*Diode Laser Arrays*, pp. 368–371, edited by Dan Botez and Don E. Scifres.

L. W. Tu, Y.H. Wang, E.F. Schubert, B.E. Weir; G.J. Zydzik, A.Y. Cho; "High Temperature Performance of Three–Quantum–Well Vertical–Cavity Top–Emitting Lasers;"0 Electronics Letters; pp. 457–458; V. 27 Feb. 28, 1991.

Y.H. Lee, B. Tell, K. Brown–Goebeler, J.L. Jewell, R.E. Leibenguth, M.T. Asom, G. Livescu, L. Luther & V.D. Mattera; "High Efficiency (1–2mW/mA) Top–Surface–Emitting GaAs Quantum Well Lasers;" Electronics Letters; pp. 1308–1310; vol. 26 Aug. 2, 1990.

Y.H. Lee, T. Tell, K. Brown–Goebeler, J.L. Jewell, C.A. Burrus & M.V. Hove; "Characteristics of Top–Surface–Emitting GaAs Quantum–Well Lasers;" IEEE Photonics Technology Letters, pp. 686–688; vol. 2, No. 9; Sep. 1990.

H. Uenohara, F. Koyama & K. Iga; "AlGaAs/GaAs Multiquantum–Well (MQW) Surface–Emitting Laser;" Electronics Letters; pp. 770–771; Jun. 8, 1989 vol. 25, No. 12.

F. Koyama, S. Kinoshita & K. Iga; "Room–temperature continuous wave lasing characteristics of a GaAs vertical cavity surface–emitting laser;" pp. 221–222; Appl. Phys. Lett. 55 (3) Jul. 17, 1989.

KD. Choquette, G. Hasnain, Y.H. Wang, J.D. Wynn, R.S. Freund, A.Y. Cho & R.E. Leibenguth; "GaAs Vertical–Cavity Surface Emitting Lasers Fabricated by Reactive Ion Etching;" pp. 859–862; IEEE Photonics Technology Letters; vol. 3, No. 10 Oct. 1991.

K. Tai, R.J. Fischer, K.W. Wang, S.N.G. Chu & A.Y. Cho; "Use of Implant Isolation for Fabrication of Vertical Cavity Surface–Emitting Laser Diodes;" pp. 1644–1645; Electronics Letters; vol. 25, No. 24 Nov. 23, 1989.

P.R. Claisse, W. Jiang, P.A. Kiely, M. Roll, L. Boughter, P. Sanchez, D. Cotney, M. Lebby, B. Webb, B. Lawrence; "Automatic Power Control of a VCSEL Using and Angled LID T056 Package;" pp. 203–209; 1998 Electronic Components and Technology Conference.

* cited by examiner

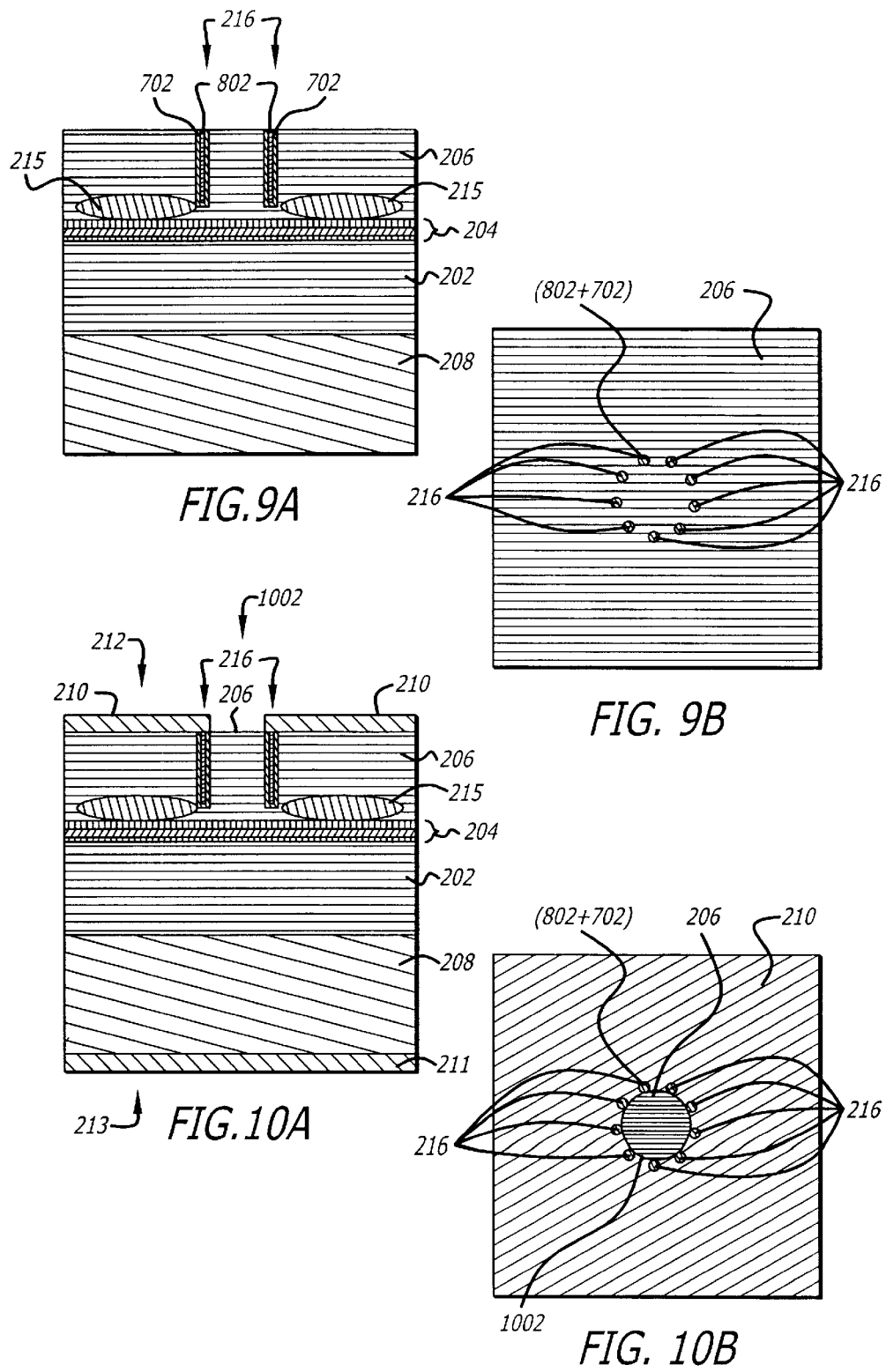

METHOD AND APPARATUS FOR PLANAR INDEX GUIDED VERTICAL CAVITY SURFACE EMITTING LASERS

FIELD OF THE INVENTION

The present invention relates generally to semiconductor lasers. More particularly, the present invention relates to vertical cavity surface emitting lasers (VCSELs).

BACKGROUND OF THE INVENTION

Semiconductor lasers have become more important. One of the more important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media.

The operation of basic semiconductor lasers is well known. Semiconductor lasers can be categorized as surface emitting or edge emitting depending upon where laser light is emitted. They may also be classified by the type of semiconductor junctions used such as heterojunction or homojunction Referring to FIG. 1A, a prior art vertical cavity surface emitting-laser (VCSEL) 100 is illustrated. VCSEL 100 is cylindrical in shape and includes heterojunctions. When VCSEL 100 is lasing, the laser light is emitted from the top surface in a region defined by the optical confinement region 103. VCSEL 100 includes a first terminal 101 and a second terminal 102 coupled respectively to the top and bottom surfaces of the VCSEL to provide current and power. VCSEL 100 includes distributed Bragg reflector (DBR) layers 104A and 104B defining the optical confinement region 103. The optical confinement region 103 provides optical confinement such that the light can be reflected between the DBR layers 104A and 104B in a reinforcing manner to provide light amplification. VCSEL 100 includes heterojunction layers 105 which forms an active region 106 with the optical confinement region 103. The active region 106 provides current confinement so as to provide lasing when a threshold current is supplied to the VCSEL 100. Threshold current is the current level required for injecting enough carriers (electrons and holes) for lasing to occur. When lasing, the VCSEL 100 has a transverse mode field 108 and a longitudinal mode field 109. To improve optical confinement index guiding may be used. Index guiding uses layers of different compounds and structures to provide a real refractive index profile to waveguide the light. Alternatively a VCSEL may be gain guided. In gain guiding, the carriers induce a refractive index difference which is a function of the laser current level and output power.

There are three types of prior art VCSEL devices that are of interest. These are planar proton implanted VCSELs, ridge waveguide VCSELs (RWG) and oxide confined VCSELs. Referring now to FIG. 1B, a planar proton implanted VCSEL 110 is illustrated. Planar proton implanted VCSELs are relatively easy to fabricate and have a planar top surface that allows easy contact metalization and metal interconnect. As a result, a large contact area can be manufactured with low resistance. However, planar proton implanted VCSELs lack sufficient index refraction difference in the lateral direction to provide good optical confinement. Optical confinement of planar proton implanted VCSELs is generated by gain guiding and thermal lensing effect caused by heating. The thermal lensing effect (diverging/converging) provides a change in the index of refraction as a proportion of temperature due to the heating of the junctions. These methods of optical confinement provide poor performance and result in planar proton implanted VCSELs having a high threshold current, large turn-on delay and large timing jitter. The turn on delay and timing jitter of a VCSEL are functions of the threshold current. The lower the threshold current the easier it is to turn on a VCSEL and the less is the turn on delay time needed to generate the appropriate amount of current with the VCSEL for lasing. The higher the turn on threshold the greater is the timing jitter in turning on and off a VCSEL. The high threshold current additionally implies a higher operation current and thus a shorter lifetime in the operation of the planar proton implanted VCSEL. The planar proton implanted VCSEL having a large turn-on delay and a large timing jitter makes it unsuitable for high speed applications beyond 2.5 Gbps.

Referring now to FIG. 1C, an improvement over planar proton implanted VCSELs is the prior art ridge waveguide proton implanted VCSEL 120. Ridge waveguide VCSELs have stronger optical mode confinement provided by the large index refraction difference between semiconductor and air. This large index refraction is similar to what is provided by edge emitting semiconductor lasers. The ridge waveguide proton implanted VCSEL provides a lower threshold current than a planar proton implanted VCSEL and thus potentially longer operational lifetime. The thermal lensing effect is minimal in ridge waveguide proton implanted VCSELs, and thus have fast turn-on and turn-off times. The timing jitter in ridge waveguide proton implanted VCSELs is much smaller than that of planar VCSELs. The ridge waveguide proton implanted VCSELs can potentially operate up to 5 Gbps, beyond which, they are limited by an RC time constant—the resistance being that of the device. However, ridge waveguide VCSELS are difficult to manufacture because of their nonplanar surface. The top surface metalization of a ridge waveguide VSCEL is particularly difficult to manufacture. A disadvantage to ridge waveguide VCSELs is that the heat dissipation is poor resulting in a thermal resistance typically 50% greater than that of planar proton implanted VCSELs. Thermal resistance causes a temperature rise in the active region as a function of the dissipated power therein. Heat dissipation is a very important factor in improving semiconductor device reliability. Large device resistances result in large RC time constants, ultimately limiting the device from high speed applications.

Referring now to FIG. 1D and FIG. 1E, an improvement over ridge waveguide VCSELs is the prior art oxide confined VCSELs 130 and 140. Oxide confined VCSELs utilize a partially oxidized AlAs layer to provide current blocking for current confinement. Oxide confined VCSELs have lower threshold currents due to good current confinement and lower resistance that allows for high speed operation. Depending on where the oxidized current blocking layer is manufactured in an oxide confined VCSEL, optical confinement for the optical mode of the semiconductor laser can be provided by the index refraction difference between the oxidized portion of the AlAs layer and the non-oxidized portion of the AlAs layer. Typically, $Al_2O_3$ has an index of refraction of about 1.5 and AlAs has an index of refraction of 2.9. Disadvantages associated with the oxidized VCSEL technology are difficult manufacturability (i.e., low yield) and poor uniformity, consistency, and reliability. Generally, it is desirable to avoid oxidizing a material within a VSCEL because it creates lattice defects that will grow and eventually degrades VCSEL device performance. In addition, stresses caused by the volume change after material oxidation accelerates VCSEL device degradation.

BRIEF SUMMARY OF THE INVENTION

Briefly, the present invention includes a method, apparatus and system for planar index guided vertical cavity surface emitting lasers as described in the claims.

The apparatus and manufacture of a planar index guided vertical cavity surface emitting laser (VCSEL) is provided. Planar index guided vertical cavity surface emitting laser (PIG VCSEL) utilizes index guiding to provide improved optical confinement and proton implantation to improve current confinement. Index guiding is achieved by etching a plurality of index guide openings (holes, partial ridges or other shapes) into a p-DBR mirror around the desired optical confinement region. The index guiding may be adjusted by varying the etched volume and depth of index guide openings (holes, partial ridges, or other shapes). The degree of index guiding is achieved by controlling the etching profile and etching depth. The degree of current confinement is achieved by controlling the implant depth and the overlap between the implant portion and etching portion. Index guiding minimizes thermal lensing effects, and thus provides a smaller turn-on delay and a smaller timing jitter. The planar index guided (PIG) VCSELs provides good optical mode confinement and current confinement, and thus lower threshold current, allowing low power consumption and higher reliability. The top contact (p-metal) surface area is increased in the PIG VCSEL thereby lowering contact and device resistance to improve VCSEL performance further. Parasitic capacitance is also reduced by providing the increased top contact surface area to provide improved high speed operation. The PIG VCSEL is a planarized device having a planar top surface for ease of manufacture. The simple methods of manufacturing PIG VCSELs are disclosed herein.

BRIEF DESCRIPTIONS OF THE DRAWINGS

FIGS. 9A and 9B are cross sectional and top views respectively of contact etching manufacturing step for the planar index guided vertical cavity surface emitting laser of the present invention.

FIGS. 10A and 10B are cross sectional and top views respectively of the top and bottom contact deposition manufacturing step for the planar index guided vertical cavity surface emitting laser of the present invention.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

A planar index guided vertical cavity surface emitting laser (PIG VCSEL) is provided by the present invention offering improved performance over prior art VCSELs in order to improve communication systems. The PIG VCSEL is substantially planar for ease of manufacturing and provides current confinement by proton implantation and optical confinement by etching holes or partial ridges within the VCSEL surrounding the optical confinement region for index guiding. The desired degree of index guiding is achieved by controlling the etching profile, volume and depth of the etching process for holes or partial ridges. The degree of current confinement is achieved by controlling the implantation depth of the protons and the overlap between the implantation region of the protons and the etched regions of the holes or partial ridges.

Figure 1A:
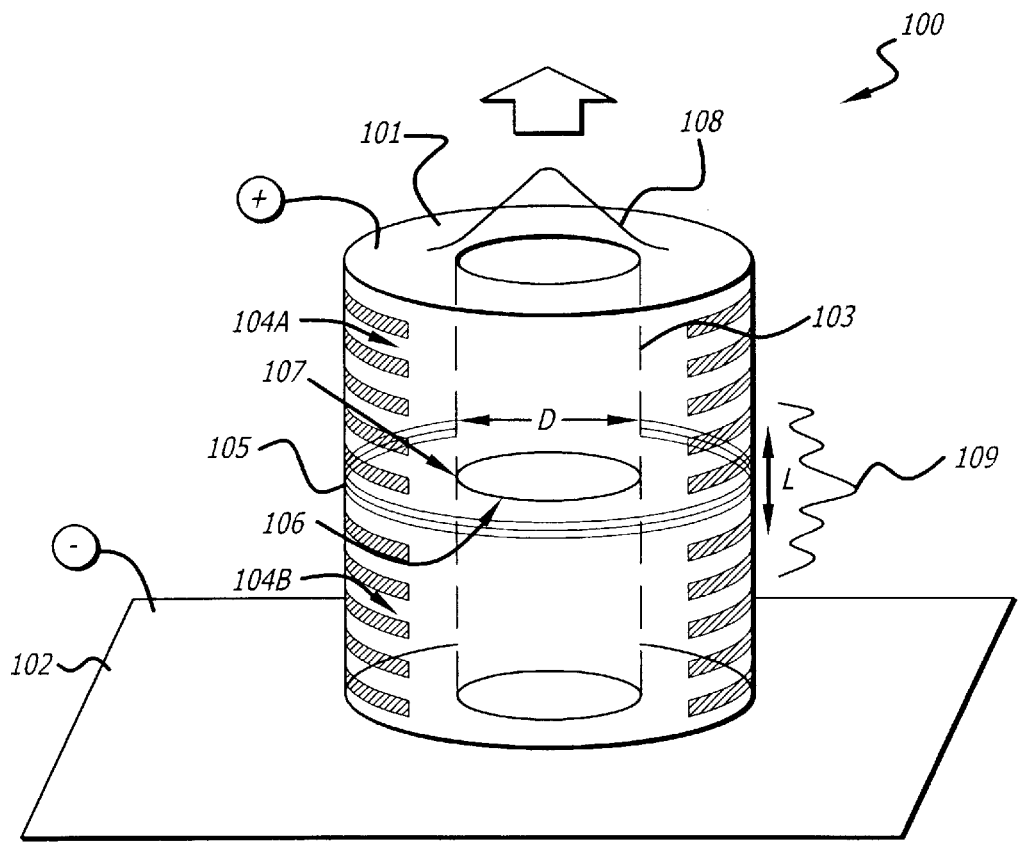
FIG. 1A is a three dimensional diagram of a prior art VCSEL structure.
Figure 1B:
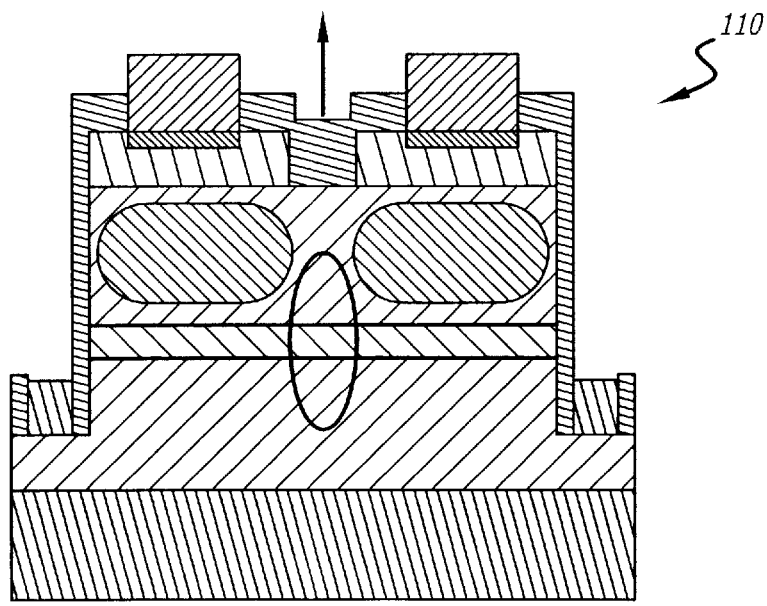
FIG. 1B is a cross sectional view of a prior art planar proton implanted VCSEL.
Figure 1C:
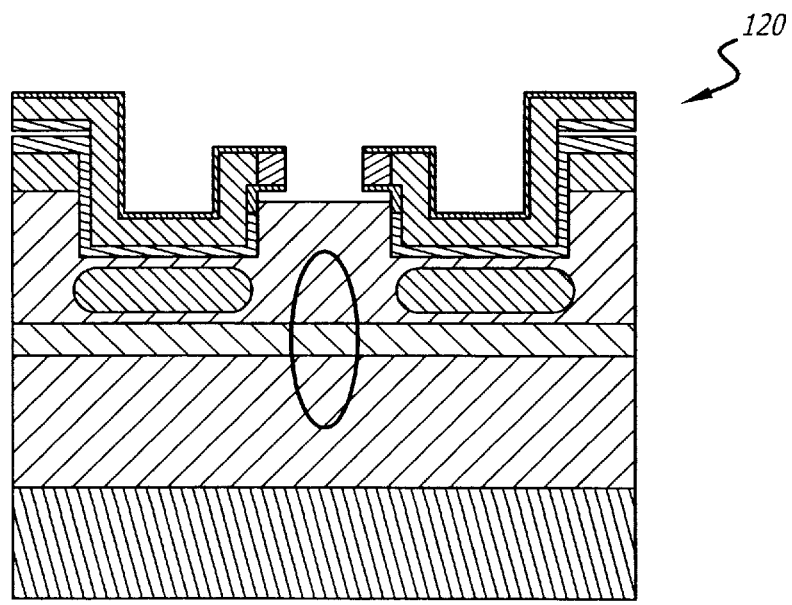
FIG. 1C is a cross sectional view of a prior art ridge waveguide proton implanted VCSEL.
Figure 1D:
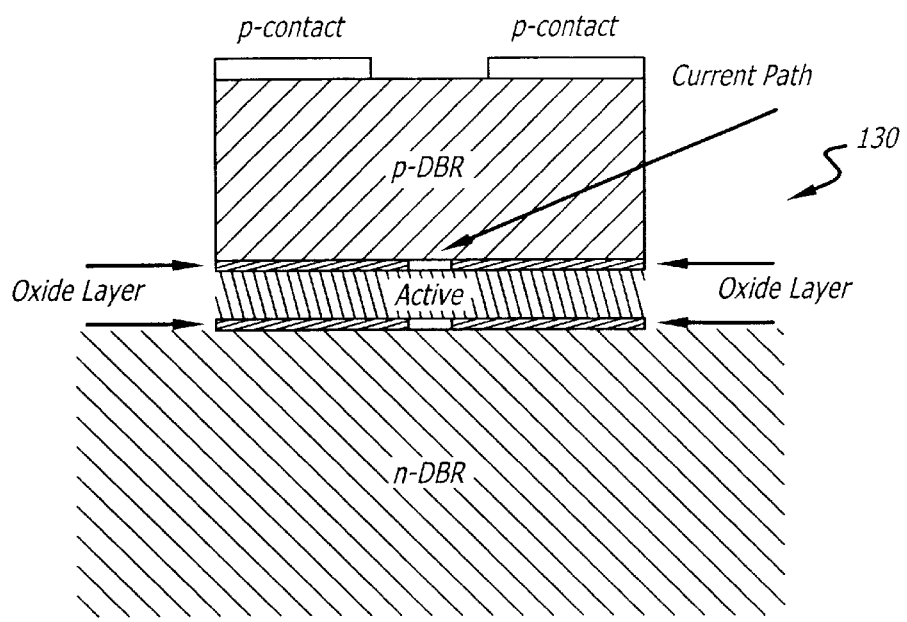
FIG. 1D is a cross sectional view of a prior art oxide confined VCSEL.
Figure 1E:
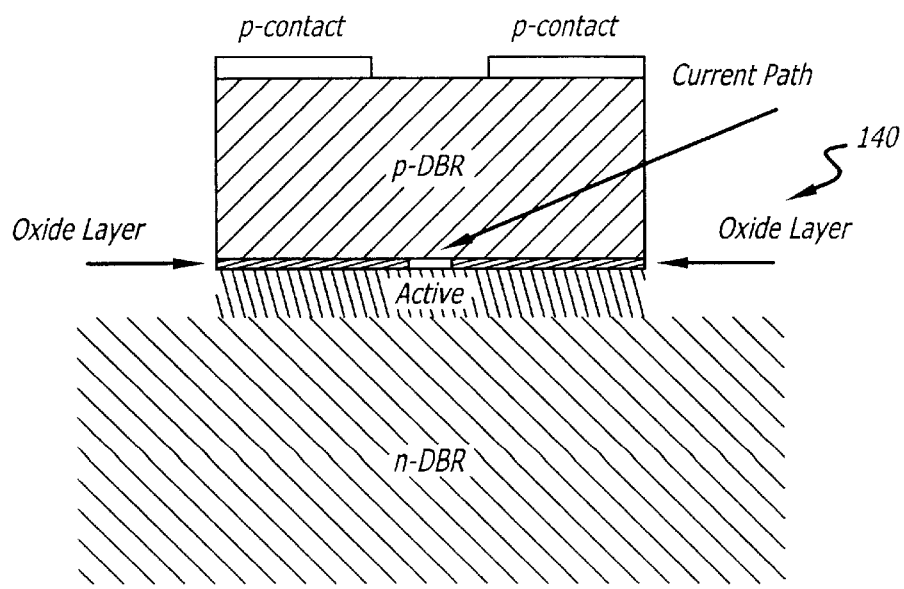
FIG. 1E is a cross sectional view of a second prior art oxide confined VCSEL.
Figure 2:
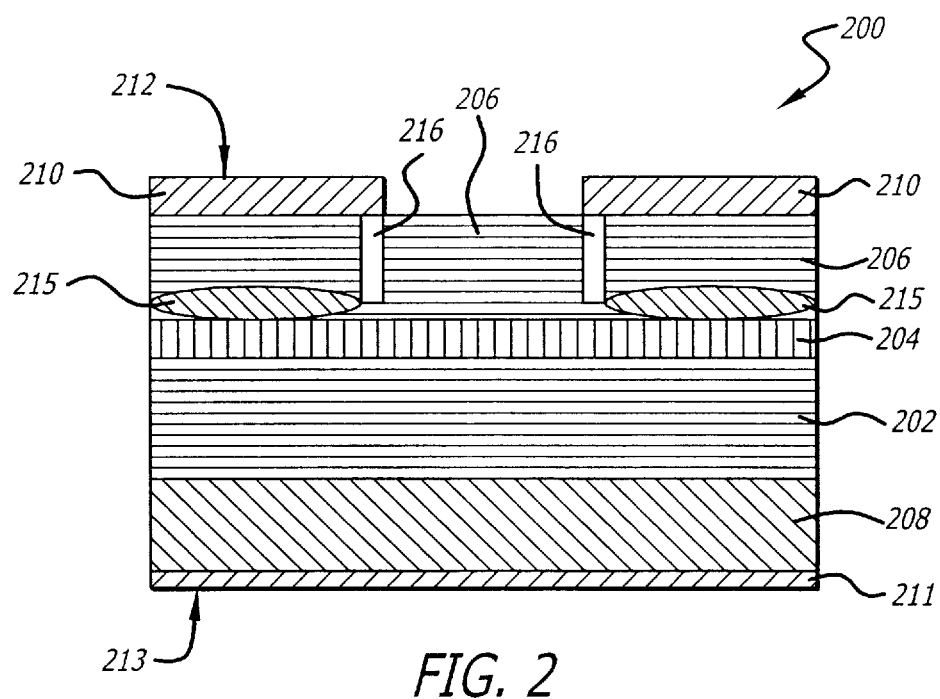
FIG. 2 is a cross sectional view of a planar index guided vertical cavity surface emitting laser according to the present invention.

Referring now to FIG. 2, a cross section of a PIG VCSEL 200 of the present invention is shown. The PIG VCSEL 200 is preferably formed in epi wafers. The PIG VCSEL 200 includes a bottom n-type distributed Bragg reflective mirror (n-DBR) 202, an active area 204 with quantum wells, and a top p-type distributed Bragg reflective (p-DBR) mirror 206. The substrate 208 of the epi wafers and thus the PIG VCSEL is GaAs. The substrate 208 is n-doped if contact terminals (p-metal) 210 and (n-metal) 211 are on top and bottom surfaces 212 and 213 respectively of the PIG VSCEL 200 as illustrated in FIG. 2 or the substrate 208 is semi-insulating if both contacts are made on the top surface. The bottom n-DBR mirror 202 is composed of $Al_xGa_{1-x}As/Al_yGa_{1-y}As$ doped with n-type dopants, such as Si, with the ratio of atoms indicated by subscript x being able to vary over the range of 0 to 0.5 and ratio of atoms indicated by subscript y being able to vary over the range of 0.5 to 1. Each $Al_xGa_{1-x}As$ and $Al_yGa_{1-y}As$ layer of the mirror 202 is preferably a quarter of a wavelength in thickness of the desired frequency of operation. For a frequency having a wavelength of 850 nanometers (nm) of the emitted laser light, it is desirable to have between twenty to fifty pairs of $Al_xGa_{1-x}As/Al_yGa_{1-y}As$ layers used for the n-DBR 202. A PIG VCSEL emitting a laser light having a desired wavelength of 780 nm can be achieved using a similar structure. The active region 204 is composed of cladding layers and active quantum wells. The cladding layers are composed of $Al_xGa_{1-x}As$ on both sides of the active quantum wells with subscript x being able to vary from 0.6 to 0.3. The cladding can be graded with x linearly changing from 0.6 at the interface with DBR mirrors 202 and 206 to 0.3 at the interface with the active quantum wells. The portion of the cladding close to the DBR mirrors 202 and 206 can also be doped with dopants similar to that used in the DBR mirrors 202 and 206. The active area 204 preferably has three to five quantum wells each composed of a GaAs quantum well and $Al_xGa_{1-x}As$ barriers. The GaAs quantum well thickness can vary from 6–12 nm, and the $Al_xGa_{1-x}As$ barrier thickness can vary from 6–12 nm. The x in the barriers varies from 0.2 to 0.4 and is typically 0.3. The active region 204 is preferably not doped with a dopant. The top p-DBR mirror 206 is composed of $Al_xGa_{1-x}As/Al_yGa_{1-y}As$ which is doped with p-type dopants such as C and Zn. For the top p-DBR mirror 206, x can vary from 0 to 0.5 and y vary from 0.5 to 1. Each $Al_xGa_{1-x}As$ and $Al_yGa_{1-y}As$ layer in the mirror 206 is preferably a quarter of a wavelength in thickness. Preferably the p-DBR mirror 206 has between 15 to 45 pairs of $Al_xGa_{1-x}As/Al_yGa_{1-y}As$ layers for the desired wavelength of laser light emission of around 850 nm. For a wavelength of 780 nm of laser light emission, a similar structure may also be used.

Figure 3:
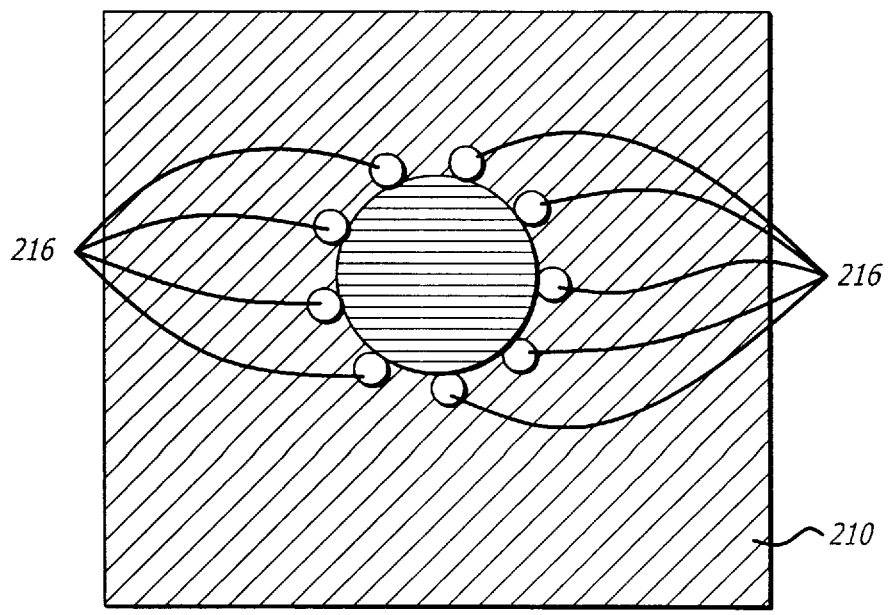
FIG. 3 is a top view of one embodiment of the planar index guided vertical cavity surface emitting laser according to the present invention.
Figure 4A:
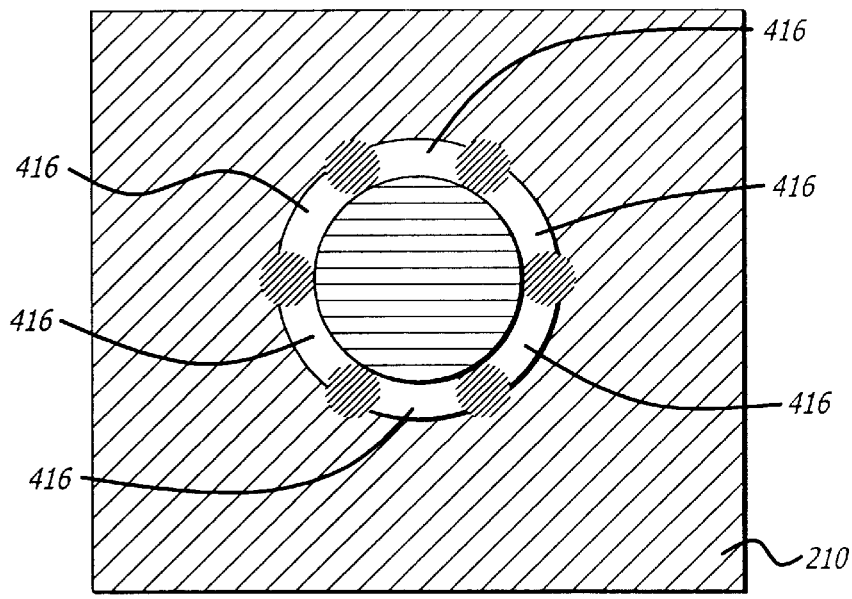
FIGS. 4A–4B are top views of an alternative embodiment of a planar index guided vertical cavity surface emitting laser according to the present invention.

Current confinement in the PIG VCSEL 200 is provided by the implanted proton region 215. The implanted proton region 215 is implanted in a cylindrical fashion around the desired area of emission of laser light resulting in a washer shaped region having a varying thickness beneath the top surface 212 of the VCSEL 200. The thickness of the washer shaped implanted proton region 215 varies from a maximum at a midpoint between outer and inner cylindrical surfaces to minimums at each of the outer and inner cylindrical surfaces. Referring now to FIGS. 2 and 3, a plurality of index guide openings (holes 216) are etched in the VCSEL 200 to provide optical confinement through index guiding. The number of index guide openings (holes 216), as well as their etching profile and depth, control the desired degree of index guiding in the PIG VCSEL 200. The overlap between the proton implantation region 215 and the etched index guide openings (holes 216) also influences the current confinement of the PIG VCSEL 200. To alternatively provide optical confinement, a plurality of etched partial ridges or other shapes may be etched into the PIG VCSEL 200. FIG. 4A illustrates how partial ridges 416 are alternatively etched into the PIG VCSEL to provide optical confinement through index guiding. The partial ridges 416 are arc shaped regions etched into the p-DBR 206 surrounding the optical confinement region. A plurality of other etched shapes may be etched into the p-DBR 206 to surround and form the optical confinement region. The holes 216, partial ridges 416 and other etched shapes may be referred to as index guide openings, it being understood that holes 216 may be substituted for one the other etched shapes patterned and etched more than once into the p-DBR 206. The index guide openings (etched holes 216 or etched partial ridges 416) may be filled with a polyamide, an oxide growth or SiN to provide an alternate index of refraction as opposed to leaving them filled with a gags such as air and its respective index of refraction.

Figure 4B:
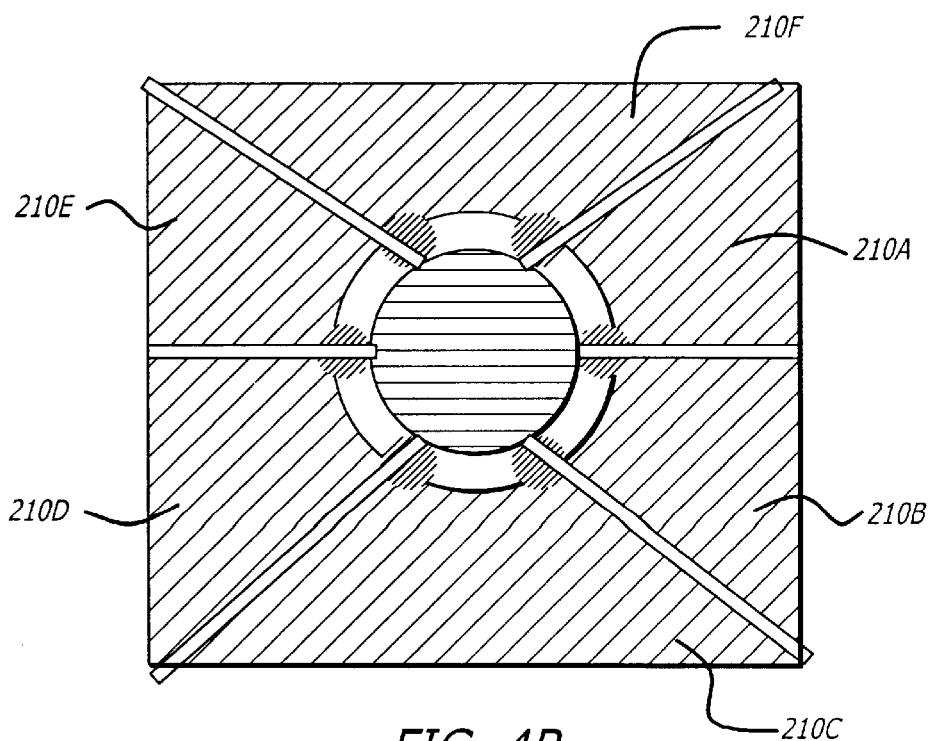

To provide further control over the current confinement for the PIG VCSEL, the top surface terminal (p-metal) 210 may be split up into multiple terminals such as illustrated by the multiple terminal regions 210A–210F in FIG. 4B. In this manner, each terminal region 210A–210F may be separately modulated to provide the desired amount of current confinement for the,PIG VCSEL.

Figure 5A:
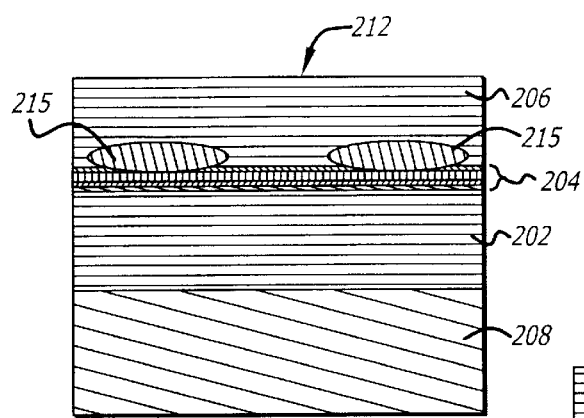
FIGS. 5A and 5B are cross sectional and top views respectively of the proton implantation manufacturing step for the planar index guided vertical cavity surface emitting laser of the present invention.
Figure 5B:
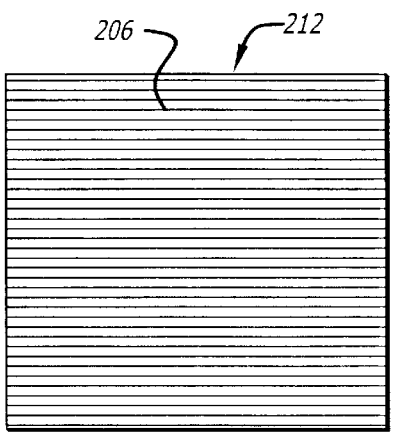

Fabrication of the PIG VCSEL 200 is now described with reference to FIG. 5A through FIG. 10B. For ease of understanding, FIGS. 5A through 10B illustrate the manufacturing of a single PIG VCSEL with the understanding that multiple PIG VCSEL devices are manufactured over a wafer at the same time. After forming an epitaxial wafer with n-DBR 202, active area 204, and p-DBR 206 in the GaAs substrate 208, atoms providing protons are implanted through a washer shaped region using a mask and photolithograpic techniques. This forms the proton region 215 in the PIG VCSEL 200 as illustrated in FIG. 5A. The proton region 215 surrounds the desired area of current confinement in the PIG VCSEL 200. Ionized Hydrogen are the protons that are implanted during the proton implantation step which is implanted into the proton region 215. Because of the desired depth of the proton region 215, an implant energy between 300 to 400 KeV is typically used to implant the proton atoms deep in the PIG VCSEL to the desired depth of the proton region 215 just above the active region 204. FIG. 5B shows little indication that proton implantation has occurred through the top surface 212 of the PIG VCSEL.

Figure 6A:
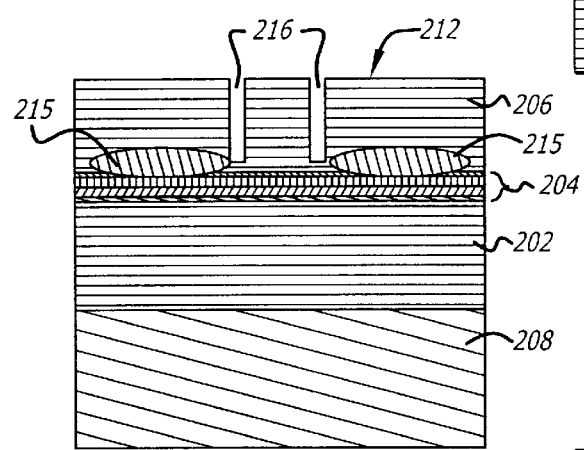
FIGS. 6A and 6B are cross sectional and top views respectively of the etching manufacturing step for the planar index guided vertical cavity surface emitting laser of the present invention.
Figure 6B:
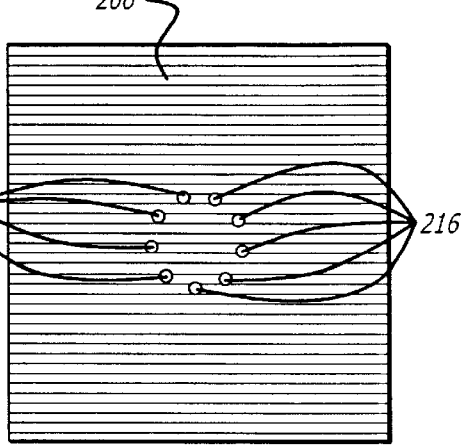

Referring now to FIGS. 6A and 6B, the holes 216 or partial ridges 416, or other etched shapes (collectively referred to as index guided openings) are next etched through the top surface of the wafer after a mask and photoligraphic techniques are used to define the etch areas on the top surface 212. For the purposes of illustration, holes 216 are illustrated as being etched into the wafer it being understood that partial ridges 416 having an arc shaped appearance around the desired area of the optical confinement region or other shapes may be etched instead of holes 216. The index guide openings (holes 216 or partial ridges 416) define the optical confinement region and a light emission aperture in the top surface 212 of the PIG VCSEL 200. The depth of the index guide openings (holes 216 or ridges 416) etched into the p-DBR 206 is down to about several $Al_xGa_{1-x}As/Al_yGa_yAs$ mirror pair layers in the p-DBR 206 above the active area 204. To accurately control the etch profile of the index guide openings (holes 216 or ridges 416) and their depth, dry etch techniques such as reactive ion etching (RIE) are preferably used over wet etch techniques.

The etched regions introduce index guiding to the optical mode that transmits through the p-DBR. Because there is a difference in the indexes of refraction between the p-DBR materials and air or SiN or polyamide, photons are reflected back into the optical confinement region to further stimulate photon emission. The level of effective index guiding is adjustable by varying the volume of etched regions. Index guiding allows better optical mode confinement and thus lowers the threshold current requirement thereby minimizing the thermal turn-on delay and timing jitter.

Figure 7A:
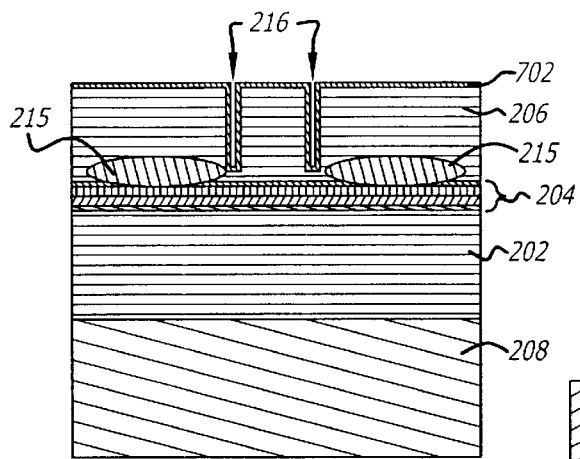
FIGS. 7A and 7B are cross sectional and top views respectively of the deposition of $SiN_x$ manufacturing step for the planar index guided vertical cavity surface emitting laser of the present invention.
Figure 7B:
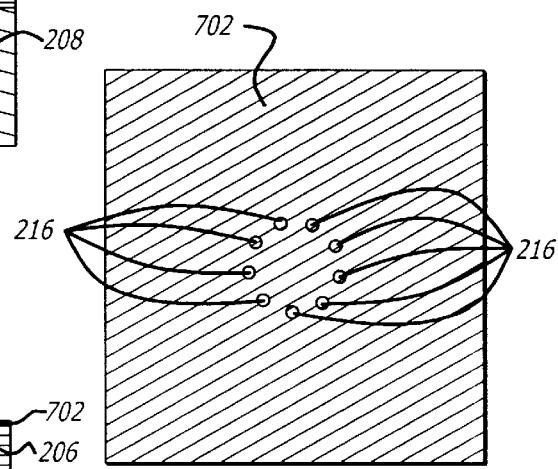

Referring now to FIGS. 7A and 7B, a layer of $SiN_x$ 702 (where x is a variable) is deposited on the top surface 212 across the wafer to provide an electrical insulation to the side walls and bottom surfaces of the index guide openings (holes 216 or ridges 416). The electrical insulation provided in this manner is also referred to as providing electrical isolation. The $SiN_x$ 702 material may be a silicon nitride, a silicon oxy nitride or other similar material. FIG. 7B illustrates the layer of $SiN_x$ 702 coating the top surface 212 and the surfaces of the index guide openings (holes 216).

Figure 8A:
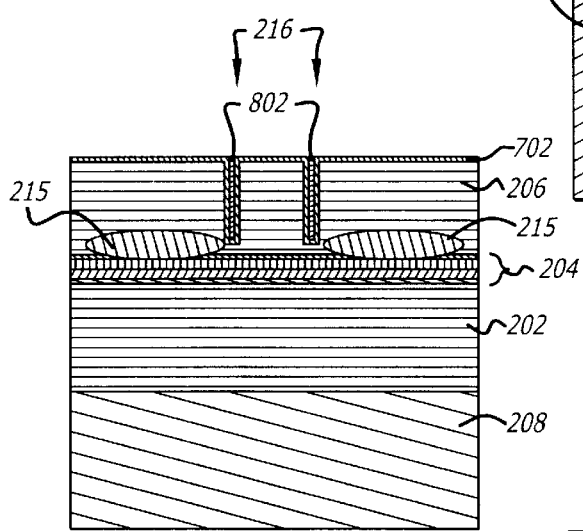
FIGS. 8A and 8B are cross sectional and top views respectively of the optional polyamide manufacturing step for the planar index guided vertical cavity surface emitting laser of the present invention.
Figure 8B:
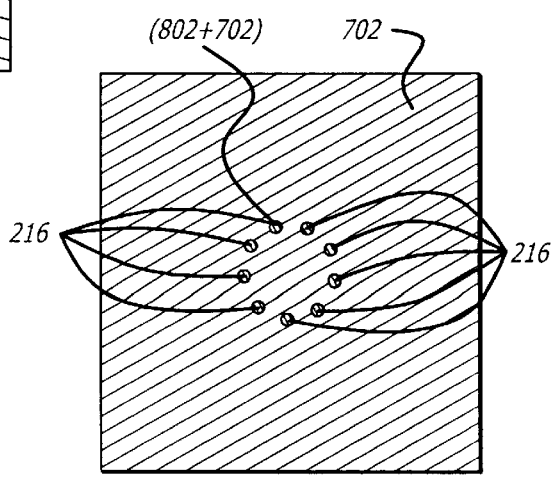

Referring now to FIGS. 8A and 8B, the remaining open volume of the index guide openings (holes 216 or partial ridges 426) can optionally be filled with a polyamide 802 to planarize the PIG VCSEL device. Alternatively, the remaining open volume may be left open to the air to provide an appropriate index of refraction to optically confine photons to the optical confinement region. If filled with polyamide, both the polyamide 802 and the $SiN_x$ 702 are within the index guide openings (holes 216) as illustrated in FIG. 8B by the reference designator (802+702).

Referring now to FIGS. 9A and 9B, the $SiN_x$ 702 on top of top surface of the p-DBR 206 is etched away so that the top contact terminal of the PIG VCSEL may be formed. The polyamide 802 filling the open volume and the $SiN_x$ 702 lining the surfaces of the holes 216 or ridges 416 remains therein after the etching step. FIG. 9B illustrates the contact surface area available on top of the p-DBR 206.

Referring now to FIGS. 10A and 10B, the top and bottom contact terminals of the PIG VCSEL are formed next. The top contact terminal (the p-metal) 210 is patterned such that the area of the optical confinement region at the surface of the p-DBR 206, the emission aperture 1002, is not covered by metal such that photons may be emitted out therefrom. FIG. 10B more clearly indicates the top contact terminal 210 surrounding the emission aperture 1002. The top contact terminal 210 may optionally cover the index guide openings (holes 216 or ridges 416). The PIG VCSEL structure allows for a greater surface area for the top contact (p-metal) terminal 210. A majority of VCSEL device resistance may be attributed to the top contact terminal 210 to the p-DBR 206 and the p-DBR 206 itself. By providing a larger surface area for the top contact terminal 210, the PIG VCSEL device resistance is reduced. As a result, the PIG VCSEL device has a lower RC time constant which translates into higher frequency of operation and greater data bandwidth. With a lower device resistance, there is less heat generated and better thermal dissipation which reduces thermal resistance and improves the PIC VCSEL's device reliability. The top contact terminal 210 may be deposited by lift-off or other metalization deposition techniques. The bottom contact terminal (the n-metal) 211 is similarly deposited to coat the bottom surface of the substrate 208 of the epi wafer. The p-metal used for the top contact terminal 210 is typically Ti:W/Au, Ti:Au/Au, Cr/ZnAu/Au, etc. The n-metal used for the bottom contact terminal 211 is typically Ni/GeAu/Au. A SiN passivation layer may be optionally grown in the emission aperture 1002 so as to protect the top surface of the p-DBR from damage. The thickness of the passivation layer can be anti-reflective to the emission wavelength. Upon completion of the top and bottom contact terminals 210 and 211, the PIG VCSEL device may be tested.

An advantage to the present invention is that it provides index guiding to provide improved optical mode confinement which in turn lowers the threshold current necessary for lasing and provides a minimal thermal turn-on delay and minimal timing jitter. The degree of index guiding may easily be modified by varying the amount of etched area of the index guide openings (holes or partial ridges). Another advantage to the present invention is that greater surface area of the top contact terminal (p-metal) is provided thereby lowering the contact resistance and the overall resistance of the VCSEL device. With a lower VCSEL device resistance (R), the RC time constant is lower which allows for greater frequency in operation, there is lower heat generated and better thermal dissipation reducing the thermal resistance and improving device reliability. Another advantage is that the present invention can be planarized so that it may be easily packaged into a laser diode package or directly integrated into a photodetector.

The preferred embodiments of the present invention for METHOD AND APPARATUS FOR PLANAR INDEX GUIDED VERTICAL CAVITY SURFACE EMITTING LASERS are thus described. While the present invention has been described in particular embodiments, the present invention should not be construed as limited by such embodiments, but rather construed according to the claims that follow below.

What is claimed is:

1. A planar index guided vertical cavity surface emitting laser comprising:

substantially planar layers of a substrate, an n-DBR mirror coupled to the substrate, an active area coupled to the n-DBR mirror, and a p-DBR mirror coupled to the active area;

the p-DBR mirror including, a plurality of index guide openings in the p-DBR mirror surrounding an optical confinement region extending from the active area to a surface of the p-DBR mirror, the index guide openings having a bottom depth approaching the active area, the index guide openings providing a different index of refraction from the index of refraction of the p-DBR mirror to provide total internal reflection for index guiding and optical confinement in the optical confinement region, an implanted proton region surrounding the optical confinement region, the implanted proton region to improve current confinement in the active area and lower the threshold current for lasing, and an electrically insulating material coating p-DBR surfaces within the plurality of index guide openings; and, a first contact terminal and a second contact terminal, the first contact terminal coupled to the p-DBR mirror in such a way to allow emission of photons from the surface of the p-DBR mirror in the optical confinement region and provide a large contact surface area with low contact resistance, the second contact terminal coupled to the substrate.

2. The planar index guided vertical cavity surface emitting laser of claim 1 wherein, the index guide openings are holes in the p-DBR mirror surrounding the optical confinement region.

3. The planar index guided vertical cavity surface emitting laser of claim 1 wherein, the index guide openings are partial ridges in the p-DBR mirror surrounding the optical confinement region.

4. The planar index guided vertical cavity surface emitting laser of claim 3 wherein, the partial ridges in the p-DBR mirror surrounding the optical confinement region are arc shaped open regions in the p-DBR mirror.

5. The planar index guided vertical cavity surface emitting laser of claim 1 wherein, the implanted proton region includes protons.

6. The planar index guided vertical cavity surface emitting laser of claim 1 wherein, the implanted proton region is washer shaped and has outer and inner cylindrical surfaces, the thickness of the washer shaped implanted proton region varying from a maximum at a midpoint between outer and inner cylindrical surfaces to minimums at each of the outer and inner cylindrical surfaces.

7. The planar index guided vertical cavity surface emitting laser of claim 1 wherein,
the p-DBR mirror further includes,
a polyamide filling in the index guide openings to substantially planarize the p-DBR mirror and provide a differing index of refraction from air.

8. The planar index guided vertical cavity surface emitting laser of claim 1 wherein,
the first contact terminal is Ti:W/Au, Ti:Au/Au, or Cr/ZnAu/Au.

9. The planar index guided vertical cavity surface emitting laser of claim 1 wherein,
the second contact terminal is Ni/GeAu/Au.

10. The planar index guided vertical cavity surface emitting laser of claim 1 wherein,
the substrate is gallium arsenide (GaAs).

11. The planar index guided vertical cavity surface emitting laser of claim 10 wherein,
the gallium arsenide (GaAs) substrate includes a p-type dopant, an n-type dopant, or a semi-insulating material.

12. The planar index guided vertical cavity surface emitting laser of claim 1 wherein,
the p-DBR mirror further includes,
an electrically insulating material filling in the index guide openings to substantially planarize the p-DBR mirror and provide a differing index of refraction from air.

13. The planar index guided vertical cavity surface emitting laser of claim 12 wherein,
the electrically insulating material is polyamide, silicon nitride (SiN), silicon oxy nitride (SiON), or silicon dioxide ($SiO_2$).

14. The planar index guided vertical cavity surface emitting laser of claim 1 wherein,
the electrically insulating material is $SiN_x$ where x is a variable.

15. The planar index guided vertical cavity surface emitting laser of claim 1 wherein,
the n-DBR mirror is layers of $Al_xGa_{1-x}As/Al_yGa_{1-y}As$ doped with an n-type dopant with x over a range of 0 to 0.5 and y over a range of 0.5 to 1.

16. The planar index guided vertical cavity surface emitting laser of claim 15 wherein,
the n-type dopant is Si.

17. The planar index guided vertical cavity surface emitting laser of claim 1 wherein,
the p-DBR mirror is layers of $Al_xGa_{1-x}As/Al_yGa_{1-y}As$ doped with a p-type dopant with x over a range of 0 to 0.5 and y over a range of 0.5 to 1.

18. The planar index guided vertical cavity surface emitting laser of claim 17 wherein,
each $Al_xGa_{1-x}As$ and $Al_yGa_{1-y}As$ layer in the P-DBR mirror is a quarter of a wavelength in thickness.

19. The planar index guided vertical cavity surface emitting laser of claim 17 wherein,
the p-DBR mirror has a range between 15 to 45 pairs of $Al_xGa_{1-x}As/Al_yGa_{1-y}As$ layers for a desired wavelength of laser light emission.

20. The planar index guided vertical cavity surface emitting laser of claim 19 wherein,
the active area includes a range of 2 to 10 active quantum wells.

21. The planar index guided vertical cavity surface emitting laser of claim 19 wherein,
the cladding layers are composed of $Al_xGa_{1-x}As$ on both sides of the active quantum wells with x varying from 0.6 to 0.3.

22. The planar index guided vertical cavity surface emitting laser of claim 17 wherein,
the p-type dopant is C or Zn.

23. The planar index guided vertical cavity surface emitting laser of claim 1 wherein,
the active area includes cladding layers and active quantum wells.

24. A vertical cavity surface emitting laser comprising:
a first mirror;
an active area coupled to the first mirror, the active area having one or more quantum wells; and,
a second mirror coupled to the active area, the second mirror having one or more index guide openings to provide internal reflection and index guide and optically confine photons in the vertical cavity surface emitting laser.

25. The vertical cavity surface emitting laser of claim 24 wherein,
the active area has an optical confinement region, and
the one or more index guide openings are holes in the second mirror surrounding the optical confinement region.

26. The vertical cavity surface emitting laser of claim 24 wherein,
the active area has an optical confinement region, and
the one or more index guide openings are partial ridges in the second mirror surrounding the optical confinement region.

27. The vertical cavity surface emitting laser of claim 24 wherein,
the second mirror having the one or more index guide openings is a p-type distributed Bragg reflective (p-DBR) mirror.

28. The vertical cavity surface emitting laser of claim 27 wherein,
the first mirror is an n-type distributed Bragg reflective (n-DBR) mirror.

29. The vertical cavity surface emitting laser of claim 24 wherein,
the vertical cavity surface emitting laser is substantially planar.

30. The vertical cavity surface emitting laser of claim 29 wherein,
the first mirror, the active area, and the second mirror are formed of substantially planar layers.

31. The vertical cavity surface emitting laser of claim 24 wherein,
the active area has an optical confinement region, and
the one or more index guide openings are holes in the second mirror within the optical confinement region.

32. The vertical cavity surface emitting laser of claim 24 wherein,
the active area has an optical confinement region, and
the one or more index guide openings are partial ridges in the second mirror within the optical confinement region.

33. A vertical cavity surface emitting laser comprising:
a first mirror;
an active area coupled to the first mirror, the active area having one or more quantum wells; and,
a second mirror coupled to the active area, the second mirror having one or more index guide openings to provide internal reflection and index guide and optically confine photons in the vertical cavity surface emitting laser, the second mirror is a p-type distributed Bragg reflective (p-DBR) mirror including,
a plurality of index guide openings in the p-DBR mirror surrounding an optical confinement region extending from the active area to a surface of the p-DBR mirror, the index guide openings having a bottom depth approaching the active area, the index guide openings providing a different index of refraction from the index of refraction of the p-DBR mirror to provide total internal reflection for index guiding and optical confinement in the optical confinement region,
an implanted proton region surrounding the optical confinement region, the implanted proton region to improve current confinement in the active area and lower the threshold current for lasing, and
an electrically insulating material coupled to surfaces of the p-DBR mirror within the plurality of index guide openings.

34. The vertical cavity surface emitting laser of claim 33 further comprising:
a substrate coupled to the first mirror;
a first contact terminal coupled to the substrate; and
a second contact terminal coupled to the p-DBR mirror, the second contact terminal to allow emission of photons from the surface of the p-DBR mirror in the optical confinement region and provide a large contact surface area with low contact resistance.

35. The vertical cavity surface emitting laser of claim 33 wherein,
the active area has an optical confinement region, and
the one or more index guide openings are holes in the second mirror surrounding the optical confinement region.

36. The vertical cavity surface emitting laser of claim 33 wherein,
the active area-has an optical confinement region, and
the one or more index guide openings are partial ridges in the second mirror surrounding the optical confinement region.

37. The vertical cavity surface emitting laser of claim 33 wherein,
the first mirror is an n-type distributed Bragg reflective (n-DBR) mirror.

38. A method of improving performance in a vertical cavity surface emitting laser (VCSEL) comprising:
index guiding photons in the VCSEL using index guide openings in a laser mirror to improve optical confinement in an optical confinement region; and
confining current in the VCSEL using proton implantation to lower a threshold current.

39. The method of claim 38 wherein,
the index guide openings are holes in a p-DBR laser mirror surrounding the optical confinement region.

40. The method of claim 38 wherein,
the index guide openings are partial ridges in a p-DBR laser mirror surrounding the optical confinement region.

41. The method of claim 40 wherein,
the partial ridge's in the p-DBR laser mirror surrounding the optical confinement region are arc shaped open regions in the p-DBR laser mirror.

42. The method of claim 38 further comprising:
increasing surface area of a top electrical contact of the VCSEL to lower contact and device resistance.

43. The method of claim 38 wherein,
the proton implantation includes protons to lower the threshold current.

44. The method of claim 38 wherein,
the VCSEL is substantially planar.

45. The method of claim 38 wherein,
the index guide openings are holes in a p-DBR laser mirror within the optical confinement region.

46. The method of claim 38 wherein,
the index guide openings are partial ridges in a p-DBR laser mirror within the optical confinement region.

47. A packaged laser diode comprising:
a vertical cavity surface emitting laser (VCSEL) to generate a laser beam output for the packaged laser diode, the VCSEL including,
a first DBR mirror,
an active area coupled to the first DBR mirror, the active area having one or more quantum wells, and,
a second DBR mirror coupled to the active area, the second DBR mirror having index guide openings to provide internal reflection to index guide and optically confine photons in the VCSEL to generate the laser beam output.

48. The packaged laser diode of claim 47 further comprising:
a photodetector to measure power in the laser beam output from the VCSEL.

49. The packaged laser diode of claim 47 wherein,
the index guide openings are holes in the p-DBR mirror.

50. The packaged laser diode of claim 47 wherein,
the index guide openings are arc shaped open regions in the p-DBR mirror.

51. The packaged laser diode of claim 47 wherein,
the second DBR mirror has a current confinement means to confine current in the active area.

52. The packaged laser diode of claim 51 wherein,
the current confinement means is a proton implantation.

53. The packaged laser diode of claim 47 wherein,
the vertical cavity surface emitting laser is substantially planar.

54. The packaged laser diode of claim 53 wherein,
the first DBR mirror, the active area, and the second DBR mirror are formed of substantially planar layers.

55. A surface emitting semiconductor laser comprising:
a first mirror means;
an active area means coupled to the first mirror means, the active area means having one or more quantum wells; and,
a second mirror means coupled to the active area means, the second mirror means having an index guiding means therein to provide internal reflection and index guide and optically confine photons in the surface emitting semiconductor laser.

56. The surface emitting semiconductor laser of claim 55 wherein,
the second mirror means further has a current confinement means to confine current in the active area means.

57. The surface emitting semiconductor laser of claim 56 wherein,
the current confinement means is a proton implantation.

58. The surface emitting semiconductor laser of claim 55 wherein,
the active area means has an optical confinement region, and the index guiding means are holes in the second mirror means surrounding the optical confinement region.

59. The surface emitting semiconductor laser of claim 55 wherein,
the active area means has an optical confinement region, and
the index guiding means are partial ridges in the second mirror means surrounding the optical confinement region.

60. The surface emitting semiconductor laser of claim 55 wherein,
the second mirror means is a p-type distributed Bragg reflective (p-DBR) mirror.

61. The surface emitting semiconductor laser of claim 60 wherein,
the first mirror means is an n-type distributed Bragg reflective (n-DBR) mirror.

62. The surface emitting semiconductor laser of claim 61 further comprising:
a substrate coupled to the n-DBR mirror.

63. The surface emitting semiconductor laser of claim 55 further comprising:
a substrate means coupled to the first mirror means.

64. The surface emitting laser of claim 55 wherein,
the surface emitting laser is substantially planar.

65. The surface emitting laser of claim 64 wherein,
the first mirror means, the active area means, and the second mirror means are formed of substantially planar layers.

66. The surface emitting semiconductor laser of claim 55 wherein,
the active area means has an optical confinement region, and
the index guiding means are holes in the second mirror means within the optical confinement region.

67. The surface emitting semiconductor laser of claim 55 wherein,
the active area means has an optical confinement region, and
the index guiding means are partial ridges in the second mirror means within the optical confinement region.

68. A vertical cavity surface emitting laser comprising:
a substrate;
a first DBR mirror coupled to the substrate,
a active area coupled to the first DBR mirror, the layers of the active area to form one or more quantum wells;
a second DBR mirror coupled to the active area, the second DBR mirror including,
an implanted proton region at a depth near the active area,
index guide openings to form an optical confinement region, and
an electrically insulating material layer to coat surfaces of the index guide openings;
a first metal layer in a top contact pattern on a surface of the second DBR mirror to form a first contact terminal and provide a low resistive contact and allow emission of photons from the optical confinement region; and,
a second metal layer coupled to a surface of the substrate to form a second contact terminal.

69. The vertical cavity surface emitting laser of claim 68 wherein,
the index guide openings are holes in the second DBR mirror.

70. The vertical cavity surface emitting laser of claim 68 wherein,
the index guide openings are arc shaped open regions in the second DBR mirror.

71. The vertical cavity surface emitting laser of claim 68 wherein,
the electrically insulating material layer is $SiN_x$ where x is a variable.

72. The vertical cavity surface emitting laser of claim 68 further comprising:
a polyamide filled into the index guide openings to substantially planarize the second DBR mirror and provide a differing index of refraction from air.

73. The vertical cavity surface emitting laser of claim 68 further comprising:
a dielectric filled into the index guide openings to substantially planarize the second DBR mirror and provide a differing index of refraction from air.

74. The vertical cavity surface emitting laser of claim 73 wherein,
the dielectric is silicon nitride (SiN), silicon oxy nitride (SiON), or silicon dioxide ($SiO_2$).

75. The vertical cavity surface emitting laser of claim 68 wherein,
the first metal layer is Ti:W/Au, Ti:Au/Au, or Cr/ZnAu/Au.

76. The vertical cavity surface emitting laser of claim 68 wherein,
the second metal layer is Ni/GeAu/Au.

77. The vertical cavity surface emitting laser of claim 68 wherein,
the substrate is gallium arsenide (GaAs).

78. The vertical cavity surface emitting laser of claim 77 wherein,
the gallium arsenide (GaAs) substrate includes a p-type dopant, an n-type dopant, or a semi-insulating material.

79. The vertical cavity surface emitting laser of claim 68 wherein,
the second DBR mirror is a p-DBR mirror.

80. The vertical cavity surface emitting laser of claim 68 wherein,
the second DBR mirror is an n-DBR mirror.

81. The vertical cavity surface emitting laser of claims 68 wherein,
the first DBR mirror is an n-DBR mirror, and
the second DBR mirror is a p-DBR mirror.

82. The vertical cavity surface emitting laser of claims 81 wherein,
the n-DBR mirror is layers of $Al_xGa_{1-x}As/Al_yGa_{1-y}As$ doped with an n-type dopant with x over a range of 0 to 0.5 and y over a range of 0.5 to 1, and
the p-DBR mirror is layers of $Al_uGa_{1-u}As/Al_vGa_{1-v}As$ doped with a p-type dopant with u over a range of 0 to 0.5 and v over a range of 0.5 to 1.

83. The vertical cavity surface emitting laser of claim 68 wherein,
the first DBR mirror is a p-DBR mirror, and
the second DBR mirror is an n-DBR mirror.

84. The vertical cavity surface emitting laser of claim 83 wherein,
the n-DBR mirror is layers of $Al_xGa_{1-x}As/Al_yGa_{1-y}As$ doped with an n-type dopant with x over a range of 0 to 0.5 and y over a range of 0.5 to 1, and
the p-DBR mirror is layers of $Al_uGa_{1-u}As/Al_vGa_{1-v}As$ doped with a p-type dopant with u over a range of 0 to 0.5 and v over a range of 0.5 to 1.

85. The vertical cavity surface emitting laser of claim 68 wherein,
the vertical cavity surface emitting laser is substantially planar.

86. The vertical cavity surface emitting laser of claim 85 wherein,
the substrate, the first DBR mirror, the active area, and the second DBR mirror are formed of substantially planar layers.

87. The vertical cavity surface emitting laser of claim 86 wherein,
the first metal layer and the second metal layer are formed of substantially planar layers.

88. The vertical cavity surface emitting laser of claim 68 wherein,
the index guide openings are formed in the second DBR mirror within a current confinement region of the active area.

89. The vertical cavity surface emitting laser of claim 68 wherein,
the index guide openings are formed in the second DBR mirror surrounding a current confinement region of the active area.

90. The vertical cavity surface emitting laser of claim 68 wherein,
the index guide openings formed in the second DBR mirror form an optical confinement region of the vertical cavity surface emitting laser.

91. An index guided vertical cavity surface emitting laser comprising:
a first-DBR mirror;
an active area coupled to the first-DBR mirror;
a second-DBR mirror coupled to the active area,
the second-DBR mirror including,
a plurality of index guide openings in the second-DBR mirror surrounding an optical confinement region extending from the active area to a surface of the second-DBR mirror, the index guide openings having a bottom depth approaching the active area, the index guide openings providing a different index of refraction from the index of refraction of the second-DBR mirror to provide total internal reflection for index guiding and optical confinement in the optical confinement region,
an implanted proton region surrounding the optical confinement region, the implanted proton region to improve current confinement in the active area and lower the threshold current for lasing, and
an electrically insulating material coating the second-DBR surfaces within the plurality of index guide openings;
a first contact terminal coupled to the second-DBR mirror to allow emission of photons from the surface of the second-DBR mirror in the optical confinement region and provide a large contact surface area with low contact resistance; and
a second contact terminal coupled to the substrate.

92. The index guided vertical cavity surface emitting laser of claim 91 wherein,
the index guide openings are holes in the second-DBR mirror surrounding the optical confinement region.

93. The index guided vertical cavity surface emitting laser of claim 91 wherein,
the index guide openings are partial ridges in the second-DBR mirror surrounding the optical confinement region.

94. The index guided vertical cavity surface emitting laser of claim 93 wherein,
the partial ridges in the second-DBR mirror surrounding the optical confinement region are arc shaped open regions in the second-DBR mirror.

95. The index guided vertical cavity surface emitting laser of claim 91 wherein,
the implanted proton region includes protons.

96. The index guided vertical cavity surface emitting laser of claim 91 wherein,
the implanted proton region is washer shaped and has outer and inner cylindrical surfaces, the thickness of the washer shaped implanted proton region varying from a maximum at a midpoint between outer and inner cylindrical surfaces to minimums at each of the outer and inner cylindrical surfaces.

97. The index guided vertical cavity surface emitting laser of claim 91 wherein,
the second-DBR mirror further includes,
a polyamide filling in the index guide openings to substantially planarize the second-DBR mirror and provide a differing index of refraction from air.

98. The index guided vertical cavity surface emitting laser of claim 91 wherein,
the first contact terminal is Ti:W/Au, Ti:Au/Au, or Cr/ZnAu/Au.

99. The index guided vertical cavity surface emitting laser of claim 91 wherein,
the second contact terminal is Ni/GeAu/Au.

100. The index guided vertical cavity surface emitting laser of claim 91 wherein,
the substrate is gallium arsenide (GaAs).

101. The index guided vertical cavity surface emitting laser of claim 100 wherein,
the gallium arsenide (GaAs) substrate includes a p-type dopant, an n-type dopant, or a semi-insulating material.

102. The index guided vertical cavity surface emitting laser of claim 91 wherein,
the second-DBR mirror further includes,
an electrically insulating filling in the index guide openings to substantially planarize the p-DBR mirror and provide a differing index of refraction from air.

103. The index guided vertical cavity surface emitting laser of claim 102 wherein,
the electrically insulating filling is polyamide, silicon nitride (SiN), silicon oxy nitride (SiON), or silicon dioxide ($SiO_2$).

104. The index guided vertical cavity surface emitting laser of claim 91 wherein,
the electrically insulating material is $SiN_x$ where x is a variable.

105. The index guided vertical cavity surface emitting laser of claim 91 wherein,
the first-DBR mirror is layers of $Al_xGa_{1-x}As/Al_yGa_{1-y}As$ doped with an n-type dopant with x over a range of 0 to 0.5 and y over a range of 0.5 to 1.

106. The index guided vertical cavity surface emitting laser of claim 105 wherein,
the n-type dopant is Si.

107. The index guided vertical cavity surface emitting laser of claim 91 wherein,
the second-DBR mirror is layers of $Al_xGa_{1-x}As/Al_yGa_{1-y}As$ doped with a p-type dopant with x over a range of 0 to 0.5 and y over a range of 0.5 to 1.

108. The index guided vertical cavity surface emitting laser of claim 107 wherein, each $Al_xGa_{1-x}As$ and $Al_yGa_{1-y}As$ layer in the second-DBR mirror is a quarter of a wavelength in thickness.

109. The index guided vertical cavity surface emitting laser of claim 107 wherein, the second-DBR mirror has a range between 15 to 45 pairs of $Al_xGa_{1-x}As/Al_yGa_{1-y}As$ layers for a desired wavelength of laser light emission.

110. The index guided vertical cavity surface emitting laser of claim 109 wherein, the active area includes between 2 to 10 active quantum wells.

111. The index guided vertical cavity surface emitting laser of claim 109 wherein, the cladding layers are composed of $Al_xGa_{1-x}As$ on both sides of the active quantum wells with x varying from 0.6 to 0.3.

112. The index guided vertical cavity surface emitting laser of claim 107 wherein, the p-type dopant is C or Zn.

113. The index guided vertical cavity surface emitting laser of claim 91 wherein, the active area includes cladding layers and active quantum wells.

114. The index guided vertical cavity surface emitting laser of claim 91 wherein, the index guided vertical cavity surface emitting laser is substantially planar.

115. The index guided vertical cavity surface emitting laser of claim 114 wherein, the first-DBR mirror, the active area, and the second-DBR mirror are formed of substantially planar layers.

116. The index guided vertical cavity surface emitting laser of claim 115 wherein, the first contact terminal and the second contact terminal are formed out of substantially planar layers.

117. The index guided vertical cavity surface emitting laser of claim 91 wherein, the index guide openings are formed in the second-DBR mirror within a current confinement region of the active area.

118. The index guided vertical cavity surface emitting laser of claim 91 wherein, the index guide openings are formed in the second-DBR mirror surrounding a current confinement region of the active area.

119. The index guided vertical cavity surface emitting laser of claim 91 wherein, the index guide openings formed in the second DBR mirror form and surround the optical confinement region of the index guided vertical cavity surface emitting laser.

* * * * *